United States Patent [19]

Barsan et al.

[11] Patent Number: 5,700,698
[45] Date of Patent: Dec. 23, 1997

[54] METHOD FOR SCREENING NON-VOLATILE MEMORY AND PROGRAMMABLE LOGIC DEVICES

[75] Inventors: Radu Barsan, Cupertino; Jonathan Lin, Milpitas, both of Calif.

[73] Assignee: Advanced Micro Devices, Inc., Sunnyvale, Calif.

[21] Appl. No.: 500,295

[22] Filed: Jul. 10, 1995

[51] Int. Cl.[6] .................. H01L 21/8217; H01L 21/66
[52] U.S. Cl. ...................... 437/8; 437/52; 437/43; 324/523; 324/769
[58] Field of Search .................. 437/8, 43, 52; 324/522, 523, 769

[56] References Cited

U.S. PATENT DOCUMENTS

| | | | |
|---|---|---|---|
| 4,607,219 | 8/1986 | Isosaka | 324/158 |
| 4,918,377 | 4/1990 | Buehler et al. | 324/691 |
| 5,032,786 | 7/1991 | Kimura | 324/158 |
| 5,298,433 | 3/1994 | Furuyama | 437/8 |
| 5,381,103 | 1/1995 | Edmond et al. | 324/753 |
| 5,394,101 | 2/1995 | Mitros | 324/769 |

Primary Examiner—John Niebling
Assistant Examiner—Richard A. Booth
Attorney, Agent, or Firm—Fliesler, Dubb, Meyer & Lovejoy LLP

[57] ABSTRACT

An improved method for screening a non-volatile memory device or programmable logic device including the steps of initially programming and then erasing a device for a predetermined number of cycles thereby providing a stressed device. Next, the stressed device is erased, providing an erased device. A first voltage value is measured across the floating gate of each cell of the erased device which is then stored for a predetermined period of time at a first predetermined temperature, providing a stored device. Next, the stored device is baked at a second predetermined temperature resulting in a baked device. Then, a second voltage value is measured across the floating gate of each cell of the baked device. Each of the first and the second voltage values are subtracted to provide a plurality of measured voltage drop values each of which are compared to an acceptable predetermined voltage drop value. The baked device is identified as defective and is discarded if any of the measured voltage drop values are greater than the acceptable predetermined voltage drop value. The first predetermined temperature is room temperature (i.e., 0°–50° C.), and the second predetermined temperature is greater than or equal to 250° C.

21 Claims, 10 Drawing Sheets

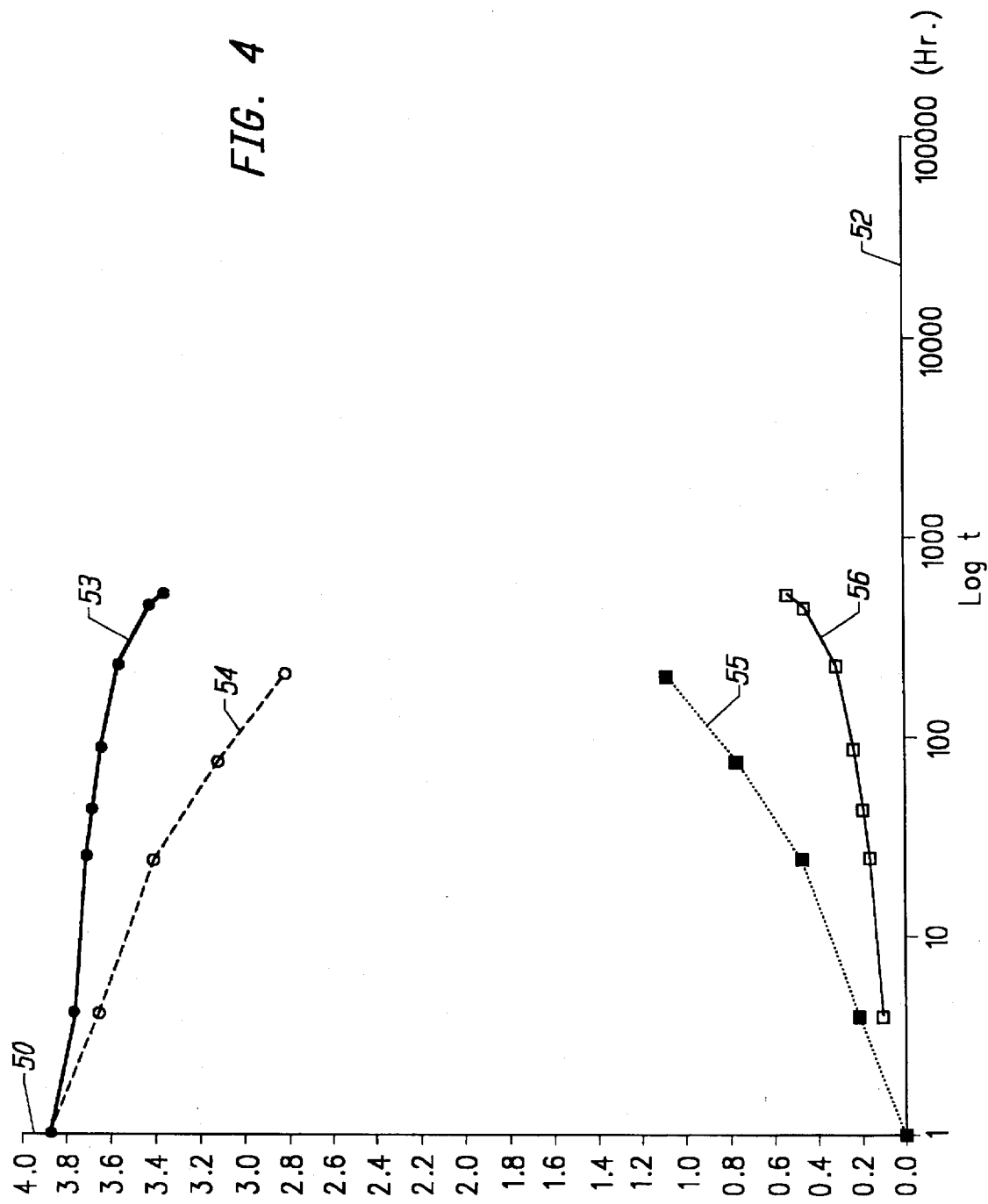

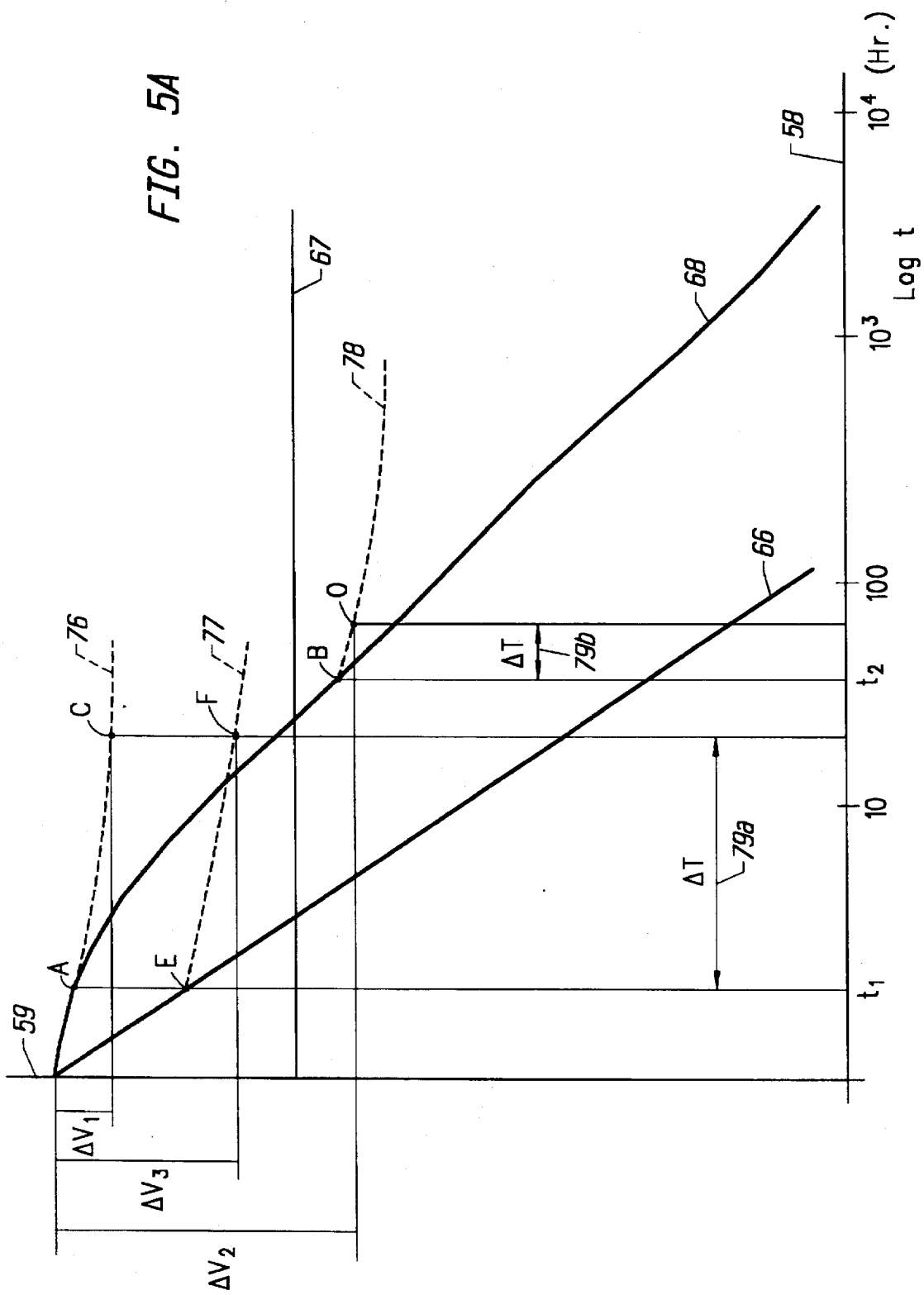

(SEE FIG. 8B)

(SEE FIG. 8A)

88 — IF ANY OF THE FIRST MEASURED VOLTAGE DROP VALUES ARE GREATER THAN THE FIRST ACCEPTABLE PREDETERMINED VOLTAGE DROP VALUE, THEN IDENTIFY THE STORED DEVICE AS DEFECTIVE AND DISCARD IT

89 — IF THE STORED DEVICE IS NOT DEFECTIVE THEN BAKE THE STORED DEVICE AT A SECOND PREDETERMINED TEMPERATURE

90 — MEASURE A THIRD VOLTAGE ACROSS THE FLOATING GATE OF EACH CELL OF THE BAKED DEVICE

91 — SUBTRACT THE FIRST AND THE THIRD VOLTAGE VALUES TO COMPUTE A PLURALITY OF SECOND MEASURED VOLTAGE DROP VALUES

92 — COMPARE EACH OF THE SECOND MEASURED VOLTAGE DROP VALUES TO A SECOND ACCEPTABLE PREDETERMINED VOLTAGE DROP VALUE

93 — IF ANY OF THE SECOND MEASURED VOLTAGE DROP VALUES ARE GREATER THAN THE SECOND ACCEPTABLE PREDETERMINED VOLTAGE DROP VALUE, THEN IDENTIFY THE BAKED DEVICE AS DEFECTIVE AND DISCARD IT

FIG. 8B

METHOD FOR SCREENING NON-VOLATILE MEMORY AND PROGRAMMABLE LOGIC DEVICES

FIELD OF THE INVENTION

The present invention relates to methods for sorting or screening both non-volatile memory devices and programmable logic devices. More particularly, the present invention relates to an improved method for screening non-volatile memory devices or programmable logic devices to identify defective devices having tunnel oxide damage caused by program-erase cycling stress and high temperature activated charge loss, the improved method including storing the devices at room temperature for a period of controlled duration.

BACKGROUND OF THE INVENTION

Non-volatile semiconductor memory devices, such as EEPROM and "flash" devices, are both electrically erasable and writable (or programmable). Such devices retain data even after power is shut down. Similarly, erasable programmable logic integrated circuits (EPLD, or PLD) use non-volatile memory cells to achieve certain reprogrammable logic functions. Non-volatile memory devices and PLDs, have a limited lifetime due to the endurance related stress such devices suffer each time they go through a program-erase cycle. The endurance of such devices is its ability to withstand a given number of program-erase cycles.

A main component of a cell of a non-volatile memory device or a PLD, is a floating gate, in a field effect transistor structure, disposed over but insulated from a channel region which is disposed between a source region and a drain region in a semiconductor substrate. A control or select gate is generally disposed over the floating gate, and is insulated therefrom by a dielectric layer. Alternatively, a control "gate" can be implemented by an adjacent diffused region of the substrate that is also insulated from the floating gate. The floating gate is, therefore, surrounded by an electrically insulating dielectric.

The threshold voltage is the minimum amount of voltage that must be applied to the control gate before the transistor is turned "on" to permit conduction between its source and drain regions, and is a function of the level of charge on the floating gate. The control gate acts as a word line to enable reading or writing of a single selected cell in a two-dimensional array of cells (i.e., a non-volatile memory device or PLD).

A cell is "erased" by holding the control gate and its source and drain regions at appropriate voltages so that electrons travel from the substrate through an intervening oxide layer (i.e., a tunnel oxide layer or a tunnel oxide) and onto the floating gate. If enough electrons are collected on the floating gate, the conductivity of the channel of the field effect transistor of the cell is changed. By measuring the conductivity of the cell, it is determined whether a binary "1" or "0" is being stored. Since the floating gate of the cell is well insulated, the cell is not volatile and retains its charge for an indefinite period without any power being applied to it.

A cell or group of cells in a non-volatile memory device or a PLD, are also "programmable." During programming, the control gate, the source and the drain regions, of a cell are held at a potential that causes electrons to move back through the tunnel oxide and into the substrate, usually the source region of the substrate. This movement reverses the effect of an earlier erase operation.

Reliability assurance is a costly, time consuming, difficult and important task in integrated circuit (IC) development and production. This is particularly true with non-volatile memory devices and PLDs. Such devices are subject to the usual IC failure mechanisms such as package and bonding failures, electrostatic discharge, electromigration, oxide breakdown, etc. Additionally, such devices must meet other reliability requirements. For example, they must retain data for ten years and must function normally (within specifications) after repeated program and erase operations, i.e., program-erase cycles.

It is known that charge loss from a floating gate of a cell of a non-volatile memory device or a PLD is caused, in part, by positive ions (such as hydrogen) which are disposed in the oxide layer surrounding the floating gate. These positive ions are free to combine with electrons collected on the floating gate. The combination of positive ions with electrons results in a net charge loss from the floating gate and weakens the data retention capability of a non-volatile memory device or a PLD. It is widely believed that high temperatures (i.e., temperatures above 200° C.) increase the diffusivity of such positive ions in the oxide layer causing an increase in the rate of ion-electron combinations thereby accelerating the charge loss from the floating gate. It is a common practice in the industry to use a high temperature bake step during a wafer sorting or screening procedure to identify a non-volatile memory device or a PLD that is prone to such high temperature activated charge loss and, therefore, has a weak data retention capability. Thus, it is known in the prior art to bake a non-volatile memory device or a PLD at high temperatures in order to accelerate the charge loss due to positive ions.

It is also known that charge loss from a floating gate of a cell of a non-volatile memory device or a PLD can occur because of stresses in the tunnel oxide caused by alternatingly programming and erasing the floating gate, i.e., program-erase cycling. The charge loss from the floating gate due to tunnel oxide stresses has not been a significant problem for devices having tunnel oxide thickness greater than about 100 Å. Since the cells of such a prior art non-volatile memory device or PLD has a tunnel oxide thicknesses on the order of 100 Å, screening for charge loss caused by tunnel oxide stresses has not been a significant concern in prior art screening procedures.

FIG. 1 illustrates a prior art method 10 for sorting or screening a non-volatile memory device or a PLD. At step 11, a non-volatile memory device or a PLD is stressed, i.e., alternatingly programmed and then erased. During erase, electrons are drawn through the tunnel oxide and are collected on the floating gate of a cell of the device. During programming, electrons are attracted from the floating gate into the tunnel oxide and into the substrate.

At step 12, each cell of the stressed device is erased a final time thereby providing an erased device. Then, at step 13, a voltage across the floating gate of each cell of the erased device is indirectly measured by means of the cell threshold voltage. Next, at step 14, the erased device is disposed in an oven and baked at high temperature (approximately 250° C.) for generally 24 hours resulting in a baked device. The baked device is removed from the oven, and, at step 15, the voltage is measured across the floating gate of each cell of the baked device.

Each of the measured voltages are subtracted to compute a plurality of measured voltage drop values, each of which is associated with a cell of the baked device. Each of the measured voltage drop values are then compared, at step 16, to an acceptable predetermined voltage drop value. The data retention capability of a non-volatile memory device or a PLD is characterized by the data retention capability of the weakest or worst cell. Therefore, if any measured voltage drop value is greater than the acceptable predetermined voltage drop value, then, at step 17, the baked device is identified as defective and is discarded.

There is a lag period (or waiting time) that exists between the completion of the final erase (step 12) and the start of the bake step (step 14). During this period, the devices are typically stored in a room temperature environment or a similar location for a period of uncontrolled duration. Therefore, in prior art screening methods, the waiting time between the final erase step and the high temperature bake step is of uncontrolled and inconsistent duration.

The prior art screening methods do not account for charge loss caused by stresses in the tunnel oxide. Heretofore, this approach has not been a problem because charge loss caused by stresses in the tunnel oxide is not significant for devices having tunnel oxide thicknesses greater than about 100 Å. However, as newer non-volatile memory or programmable logic devices are developed, and as tunnel oxide thickness become much less than 100 Å, these prior art screening methods are inadequate for detecting devices having excessive charge loss and weak data retention capability due to both positive ions and stressed tunnel oxide.

SUMMARY OF THE INVENTION

It is therefore an object of the present invention to provide an improved method for screening non-volatile memory devices or PLDs, that provides meaningful and reliable information related to the data retention capability of the screened device.

It is another object of the present invention to provide an improved method for screening non-volatile memory devices or PLDs having weak data retention capability because of both positive ions and stressed tunnel oxide.

It is yet another object of the present invention to provide an improved method for screening non-volatile memory devices or PLDs, wherein the improved method includes a room temperature storage period of predetermined and controlled duration.

Briefly, an improved method for screening a non-volatile memory device or a PLD includes the steps of initially programming and then erasing a device for a predetermined number of cycles thereby providing a stressed device. Next, the stressed device is erased, providing an erased device. A first voltage value is measured across the floating gate of each cell of the erased device which is then stored for a predetermined period of time at a first predetermined temperature, providing a stored device. Next, the stored device is baked at a second predetermined temperature resulting in a baked device. Then, a second voltage value is measured across the floating gate of each cell of the baked device. Each of the first and the second voltage values are subtracted to provide a plurality of measured voltage drop values each of which are compared to an acceptable predetermined voltage drop value. The baked device is identified as defective and is discarded if any of the measured voltage drop values are greater than the acceptable predetermined voltage drop value. The first predetermined temperature is room temperature (i.e., 0°–50° C.), and the second predetermined temperature is greater than or equal to 250° C.

In an alternate embodiment of the method of the present invention, a voltage value is measured across the floating gate of each cell of a screened device at three different times during the screening procedure. A first voltage value is measured after the device is erased, a second voltage value is measured after the erased device is taken out of storage, and a third voltage value is measured after the stored device is baked. Each of the first voltage and the second voltage values associated with a cell of the stored device are subtracted to provide a plurality of first measured voltage drop values. Each of the first measured voltage drop values are compared to a first acceptable predetermined voltage drop value. If any cell of the stored device has its associated first measured voltage drop value greater than the first acceptable predetermined voltage drop value then the stored device is identified as defective and is discarded. Stored devices that are not defective are disposed into the oven and baked at high temperature.

After the device is removed from the baking oven, each of the first and the third voltage values associated with a specific cell of the baked device are subtracted to provide a plurality of second measured voltage drop values. Each of the second measured voltage drop values are then compared to a second acceptable predetermined voltage drop value. If any cell of the baked device has its corresponding second measured voltage drop value greater than the second acceptable predetermined voltage drop value, then the baked device is identified as defective and is discarded.

An important advantage of the improved method of the present invention is it provides a reliable and accurate method for screening thin tunnel oxide non-volatile memory devices or PLDs having weak data retention capability because of tunnel oxide problems.

Another important advantage of the improved method of the present invention is that it provides a controlled reference point for determining the high temperature activated loss from non-volatile memory devices or PLDs.

These and other objects and advantages of the present invention will no doubt become apparent to those skilled in the art after having read the following detailed description of the preferred embodiment which is contained in and illustrated by the various drawing figures.

BRIEF DESCRIPTION OF THE DRAWINGS

The present invention is illustrated in more detail in the accompanying figures in which:

FIG. 4 illustrates the amount of charge measured, and the difference in the amount of charge measured on the floating gate of a cell of a device after it has been baked at 250° C. and 300° C., respectively;

FIG. 5A illustrates the effects of starting the high temperature bake period at different times during a screening method;

DETAILED DESCRIPTION OF THE PREFERRED EMBODIMENT

The following detailed description illustrates the invention by way of example, not by way of limitation of the principles of the invention. This description will clearly enable one skilled in the art to make and use the invention, and disclose several embodiments, adaptations, variations, alternatives and uses of the invention, including what we presently believe is the best mode of carrying out the invention.

The present invention is related to an improved method for sorting or screening non-volatile in-system updatable memory semiconductor devices or programmable logic semiconductor devices (PLDs), to identify or detect such devices having weak data retention capability. Memory devices and PLDs include a plurality of cells. The data retention capability of such devices are characterized by the data retention capability of the worst or weakest cell of the device. As used in this description, "non-volatile" means data stored in the memory device is retained when the device is powered off. An "in-system updatable" memory device is a device wherein stored data can be erased and replaced under control of a system processor (e.g. a host microprocessor). The screening method of the present invention is applicable to PLDs, as well as any memory device having non-volatile and in-system updatability capabilities, e.g., EEPROM, flash EEPROM, and flash EPROM.

Figure 2:
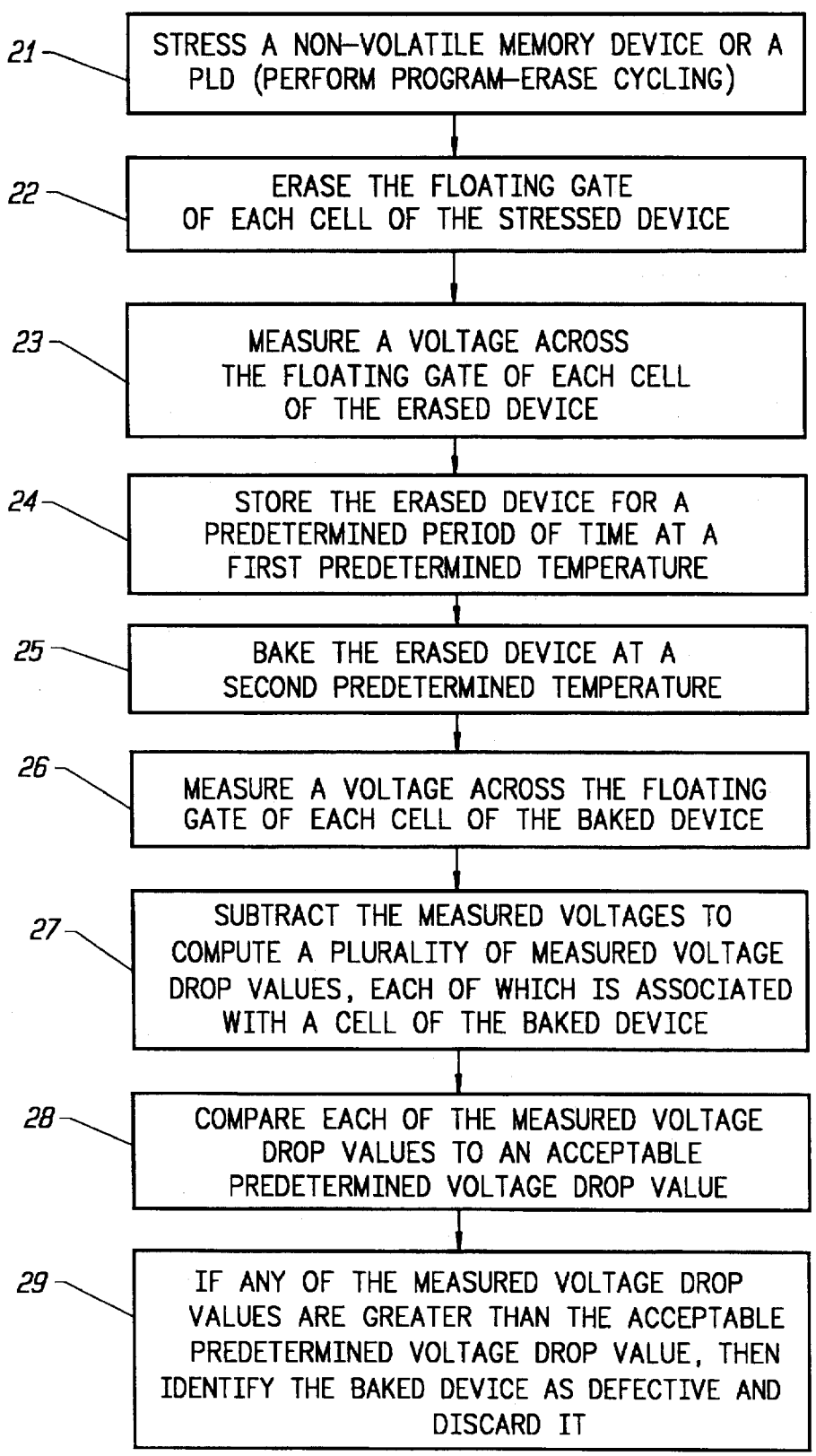
FIG. 2 is a flow chart showing a method for screening non-volatile memory devices and PLDs, in accordance with the present invention.

FIG. 2 depicts a method 20 of the present invention, for screening memory devices or PLDs. Initially, at step 21, among other tests, a device to be screened is stressed, or cycled. That is, each cell of the device is alternatingly programmed and then erased. The specific operation of programming and erasing depends on the particular device to be screened. However, for purposes of the methods of the present application disclosed herein, a cell of a device is erased if electrons are drawn to and collect on its floating gate, and a cell of a device is programmed if electrons are drawn away from its floating gate.

At a step 22, each cell of the stressed device is erased thereby providing an erased device. Next, at a step 23, a voltage is measured across the floating gate of each cell of the erased device. The erased device is then stored, at step 24, at a first predetermined temperature value for a predetermined time period. The erased device is typically stored or disposed in a room, holding area, or similar location thereby providing a stored device. The first predetermined temperature value is equivalent to room temperature, i.e., 0°-50° C. The absolute value of the length of the predetermined time period is not as important as controlling the duration of the predetermined time period. That is, every time a screening method in accordance with the present invention is performed, the duration of the predetermined time period should be the same within a tolerance range of approximately 10 percent. Typically, the predetermined time period should be 24 hours long.

After the predetermined time period has elapsed, at step 25, the stored device is disposed in an oven and baked at a second predetermined temperature value thereby resulting in a baked device. As with screening methods of the prior art, the bake is performed at temperatures greater than or equal to 250° C., and for a period of generally 24 hours.

The now baked device is removed from the oven and, at step 26, another voltage value is measured across the floating gate of each of its cells. The voltage values measured at steps 23 and 26 are subtracted, at step 27, to compute a plurality of measured voltage drop values, each of which corresponds to a cell in the baked device. Each of the measured voltage drop values are compared, at step 28, to an acceptable predetermined voltage drop value. If any of the measured voltage drop values are greater than the acceptable predetermined voltage drop value, then, at step 29, the baked device is identified as defective and is discarded.

Figure 3:
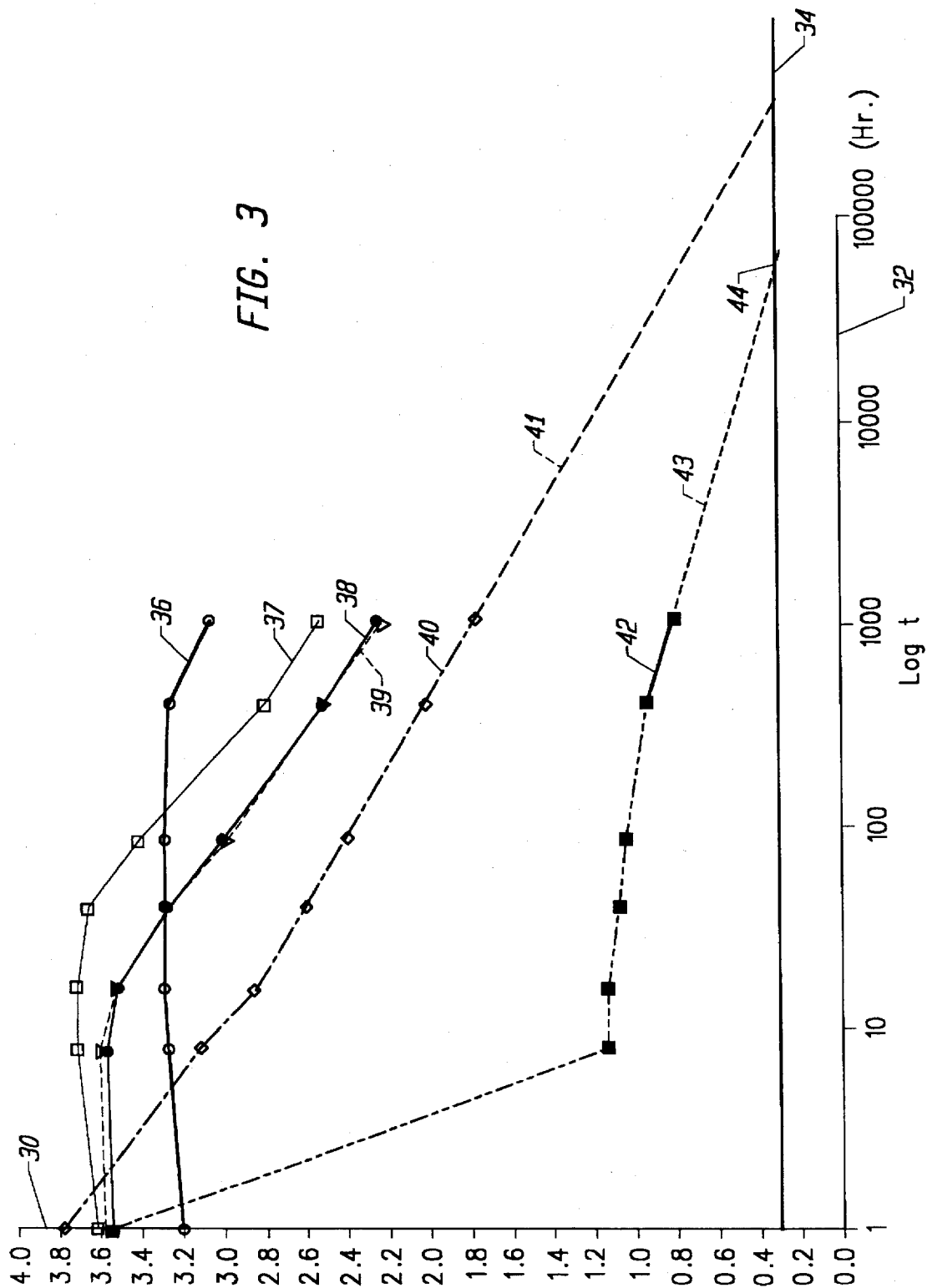
FIG. 3 depicts the predicted charge lost over time from the floating gate of the worst cell or bit in each of a plurality of 4 Kbit memory devices after each of the memory devices has been stressed in accordance with the method illustrated in FIG. 2.

Any method used to screen for defective devices must identify devices that will lose a predetermined amount of charge at the end of a 100,000 hour period. FIG. 3 depicts the charge predicted to be lost over time for the worst cell (i.e., bit) in each of a plurality of 4 Kbit memory devices, after each of the devices has been screened in accordance with the method illustrated in FIG. 2. Each of the plots 36, 37, 38, 39, 40, and 42 correspond to a specific memory device. Although memory devices are depicted in FIG. 3, it will be appreciated that similar results are obtained for PLDs.

The predicted charge loss, measured as voltage drop across the floating gate of the worst cell of a 4 Kbit memory device, is plotted along an axis 30, while time is plotted along the horizontal axis 32. Each of the plots 36, 37, 38, 39, 40, and 42 depict the measured charge loss over time from the floating gate of the associated memory device. Plots 41 and 43 are charge losses predicted or extrapolated from the measured charge losses illustrated by plots 40 and 42, respectively. Plot 36 illustrates the charge loss of the worst cell of a 4 Kbit memory device that is characterized as having the highest data retention capability. Plot 42, on the other hand, depicts the charge loss from the worst cell of the 4 Kbit memory device having the worst data retention capability. Plots 38, 39, 40, and 37 respectively illustrate, the fourth worst, the third worst, the second worst, and the median 4 Kbit memory devices.

A horizontal limit line 34 is illustrated at approximately the 0.3 Volt level. In order for a memory device to be characterized as non-defective, the charge loss can not fall below the limit line 34 before the 100,000 hour product life. For example, the memory device depicted by the plot 40 would be characterized as non-defective because the extrapolated plot 41 illustrates that the predicted charge loss at the 100,000 hour point is above the limit line 34. In contrast, the device depicted by the plot 42 would be characterized as defective (i.e a device having weak data retention capability) because the extrapolated plot 43 falls below the limit 34 at the 100,000 hour point.

Figure 1:
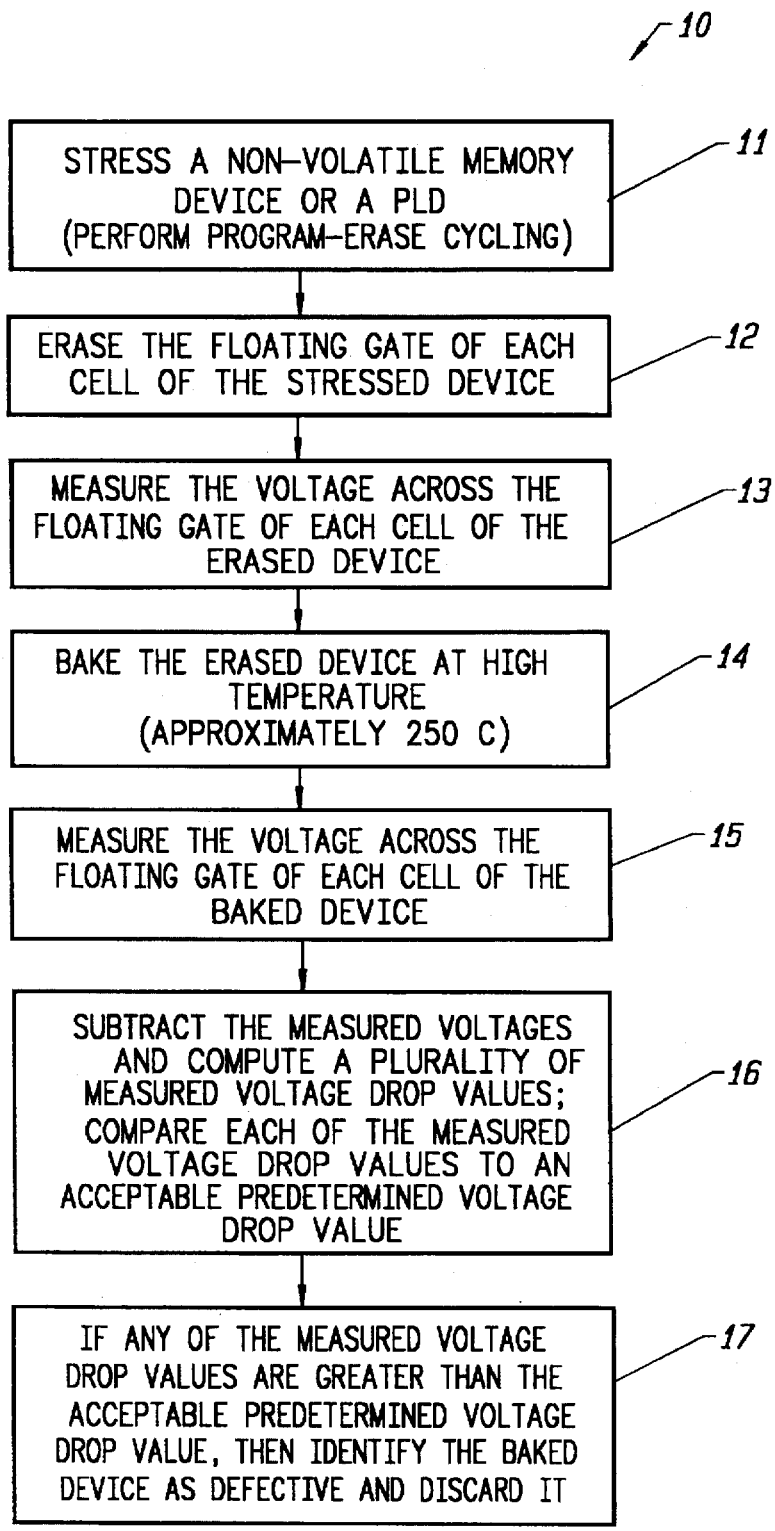
FIG. 1 is a flow chart illustrating a prior art method for screening or sorting nonvolatile memory devices and PLDs.

It is known that positive ions disposed in the oxide film surrounding the floating gate of each cell of a memory device or a PLD are a possible cause of the device having weak data retention capability. Therefore, in both the prior art screening method (FIG. 1) and a screening method of the present invention (FIG. 2), a high temperature bake is used to screen for defective devices having charge loss caused by positive ion diffusion. FIG. 4 illustrates the charge loss over time as a result of baking devices at 250° C. and 300° C. The amount of charge loss from the floating gate is shown along the axis 50, and time is plotted along the axis 52. Plots 53 and 54 illustrate the floating gate voltage of the worst cell of a device after baking it at 250° C. and 300° C., respectively. Plots 55 and 56 depict the difference in the floating gate voltage of the worst cell of the device after baking it at 250° C. and 300° C., respectively. As shown in the figure, after 24 hours, the charge loss is slight.

In electrically erasable cells having thin tunnel oxide layers, stress-induced charge loss caused by program-erase cycling, is also recognized as a challenge in the scaling of such cells. It also appears to be widely believed that in such cells having tunnel oxide thicknesses on the order of about 100 Å, stress-induced charge loss is not a significant problem. However, as the development of devices having tunnel oxide thicknesses less than about 100 Å becomes more prevalent, stress-induced charge loss problems are becoming more significant and are presenting a major obstacle to the scaling of such devices.

It is a practice in the industry to bake a device at high temperatures during a device screening procedure in order to screen out devices having weak data retention. This practice is based on the belief that baking at temperatures above 200° C. accelerates the charge loss from the floating gate of such devices. However, the inventors of the present invention have recently found that such high temperature (i.e. above 200° C.) baking stops the degradation in data retention performance at room temperature that was caused by program-erase cycling stress. That is, baking at temperatures above 200° C. accelerates the charge loss but only if the dominant cause of charge losses is due to positive ion diffusion. If the dominant cause of charge loss is due to stress-induced leakage in the scaled tunnel oxide, the high temperature bake actually anneals the damages in the tunnel oxide and suppresses the stress-induced leakage. This defeats the purpose of the wafer sort to screen out parts prone to stress damages.

FIG. 5A depicts, for a typical memory device or a PLD, a decay curve 68 that generally characterizes the charge loss from the floating gate of the weakest or worst cell in a memory device or a PLD with tunnel oxide much thinner than about 100 Å after the device is stressed or program-erase cycled. The voltage across the floating gate is plotted along the vertical axis 59, and time is plotted along the log-scaled horizontal axis 58. Therefore, the decay curve 68 qualitatively depicts the loss in charge from the floating gate as a function of time. Line 67 represents the minimum amount of voltage that should exist across the floating gate, after cycling, in order for the associated device to be acceptable.

In prior art screening methods, the duration of the period after the program-erase cycling and before the start of the high temperature bake is not monitored or controlled and the length of this period can vary from the implementation of one screening procedure to the implementation of another. The significance of this inconsistency can be shown by screening two identical lots of devices. The two identical lots are characterized by the decay curve 68. Each of the first and the second lots are cycled at the same time for the same number of cycles. However, the first lot is screened by a first screening procedure wherein the high temperature bake starts at a point A, and the second lot is screened by a second screening procedure wherein the high temperature bake starts at a point B. Under the first screening procedure, the devices of the first lot are disposed into the oven at a point in time identified by $t_1$. For the second screening procedure, in contrast, the devices of the second lot are disposed into the oven at a later point in time identified by $t_2$.

Regarding the first screening procedure, the high temperature bake alters the charge loss decay from a rate depicted by the curve 68 to a rate depicted by a curve 76. At the conclusion of the high temperature bake period 79a, denoted by the point C, the amount of charge loss from a device of the first lot is the amount $\Delta V_1$. Similarly, during the second screening procedure, the high temperature bake alters the charge loss decay from a rate depicted by the curve 68 to a rate depicted by a curve 78. At the conclusion of this high temperature bake period 79b, denoted by the point D, the amount of charge loss from a device of the second lot is the amount $\Delta V_2$. The duration of the periods 79a and 79b are identical. However, because of the log scale of the axis 58, the lengths of the periods 79a and 79b appear to be different.

As described elsewhere, the high temperature bake accelerates charge loss caused by positive ions and stops charge loss caused by stress-induced leakage in the tunnel oxide. Since the lots are assumed to be identical, the amount of positive ions in the devices of each lot are the same. Therefore, the slopes of the curves 76 and 78 are depicted as being generally similar.

The lots associated with the curves 76 and 78 are assumed to be identical and are characterized by the same decay curve 68. However, the charge loss at the conclusion of period 79a (i.e., $\Delta V_1$) does not exceed the acceptable voltage drop value represented by the line 67, while the charge loss at the conclusion of period 79b (i.e., $\Delta V_2$) does. Although the devices of the first and the second lots are identical, the devices associated with the first lot will be accepted and the devices associated with the second lot will be rejected. If the high temperature bake of the devices of the second lot were merely started at a different time, then these devices may have also been acceptable.

Thus, the prior art screening methods may be falsely rejecting devices that would be acceptable but for the mere fact of waiting a different time before starting the high temperature bake period. The prior art screening methods may lead one to attribute the cause of the charge loss to the wrong phenomena. One may be misled into fixing a problem that does not exist, while on the other hand missing devices that have weak tunnel oxide.

Prior art screening methods may also provide false positive results. For example, a decay curve 66 characterizes a device having a bad tunnel oxide. It will be noted that the slope of curve 66 is steeper than the slope of curve 68. The devices characterized by the curve 66 will lose charge from the floating gate at a faster rate than devices characterized by the curve 68. Devices characterized by the curve 68 are considered to have a "good" tunnel oxide and should be accepted, while devices characterized by the curve 66 are considered to have a "bad" tunnel oxide and should be rejected. If the high temperature bake period is started at point E (i.e., at time $t_1$) then the decay curve is altered from the curve 66 to a curve 77. At the conclusion of the bake period, i.e., the point F, the amount of charge loss from the floating gate is the amount $\Delta V_3$. The charge loss $\Delta V_3$ does not exceed the acceptable voltage drop value represented by the line 67. Thus, a screening method that starts the high temperature bake period at point E would accept a device which has a "bad" tunnel oxide.

Prior art screening methods are, therefore, prone to generating such false positive results because these methods do not control the start of the bake period. One procedure may start at point E and incorrectly accept a "bad" device, while another procedure may start at some other point and correctly reject the "bad" device. Thus, prior art screening methods yield inconsistent and essentially meaningless results.

Figure 5B:
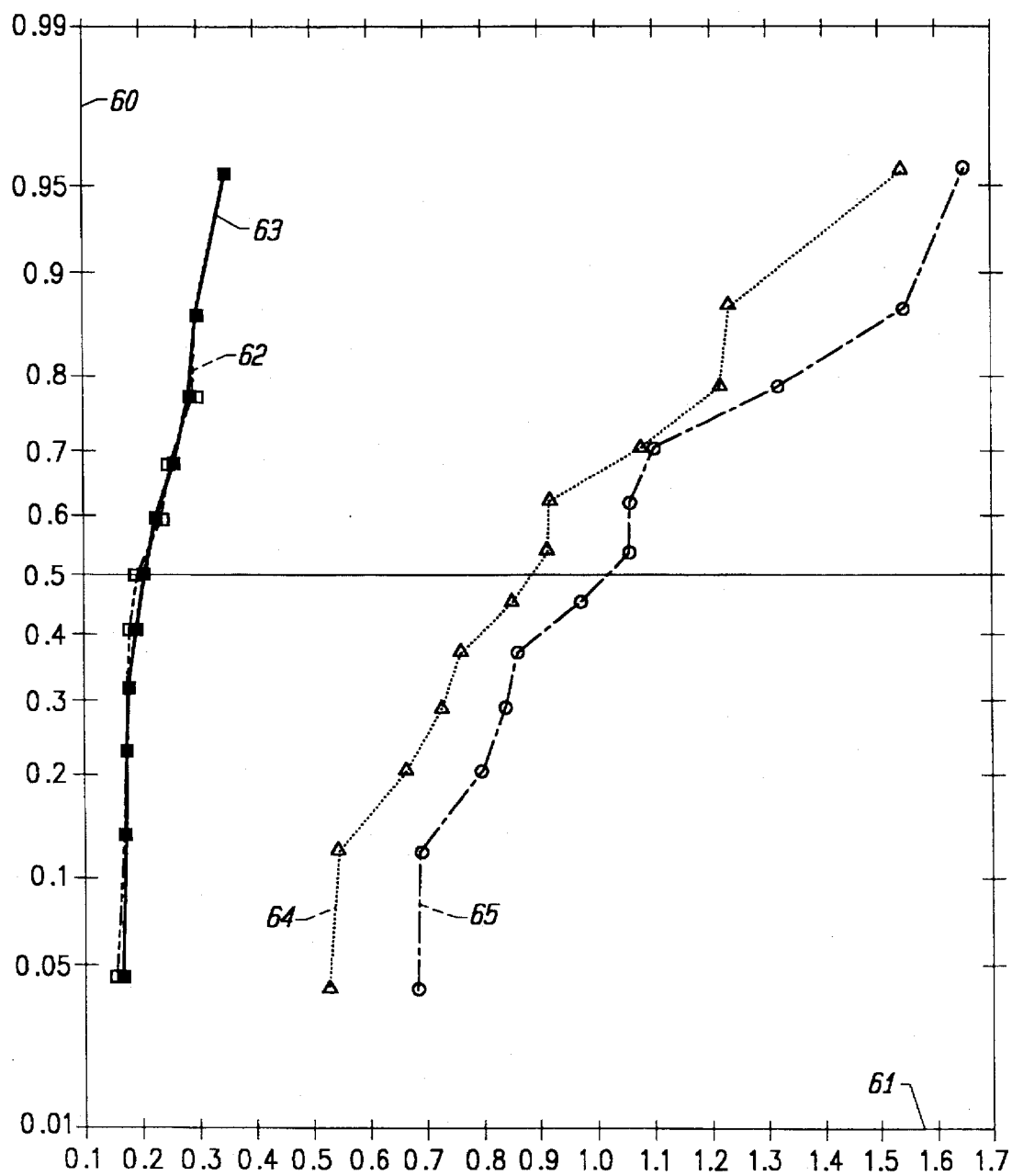
FIG. 5B illustrates four plots depicting the probability distributions of charge loss from the floating gate of the weakest cell of a stressed or cycled device.

FIG. 5B illustrates four plots depicting the probability distributions of charge loss from the floating gate of a stressed device after a predetermined time period. Cumulative probabilities are plotted along the axis 60, while the charge loss is plotted along the axis 61. A first wafer includes a plurality of devices that are characterized by plots 62 and 63. A second wafer includes a plurality of devices that are characterized by plots 64 and 65. Each of the devices are cycled 100 times. Also, each of the devices have a tunnel oxide thickness of approximately 73 Å.

The devices of the first wafer are cycled thereby causing tunnel oxide damage. Then the first wafer is nearly immediately disposed into an oven and baked at 250° C. for 109 hours. The charge loss from the floating gate of the devices of the first wafer after the high temperature bake is depicted by the plot 63. As indicated by the plot 63, the charge loss is very slight, generally between 0.15 to 0.30 Volts. The devices of the first wafer are then stored at room temperature (i.e., 25° C.) for an additional 46 hours. Plot 62 depicts the charge loss from the floating gate of the devices of the first wafer after the 46 hour storage at room temperature. As indicated by the plot 62, the charge loss is virtually unchanged from the charge loss caused by the high temperature bake. Since the first wafer was disposed into the oven "nearly immediately" after the program erase cycling, the charge loss illustrated by plots 62 and 63 is caused by positive ions and not caused by stress-inducing program erase cycling.

As is known in the art, program erase cycling causes tunnel oxide damage. However, as discovered by the inventors of the present invention a high temperature bake stops the data retention degradation caused by the program erase cycling. This phenomena is illustrated by the plots 62 and 63. Specifically, the charge loss from the floating gate of the devices of the first wafer is substantially the same after the high temperature bake (i.e., plot 63) and after the subsequent storage at room temperature (i.e., plot 62). That is, after high temperature baking, storing the first wafer at room temperature does not cause an appreciable charge loss from the floating gate of the devices.

The devices of the second wafer are initially cycled thereby causing tunnel oxide damage. Then, each device of the second wafer is erased and stored at room temperature (i.e., 25° C.) for a period of 109 hours. The charge loss from the floating gate of the devices of the second wafer after the room temperature storage is illustrated by the plot 64. As indicated by the plot 64, the charge loss from the floating gate is generally between 0.5 to 1.5 Volts. The devices of the second wafer are then stored at room temperature for a second period of 46 hours, and the charge loss from the floating gate caused by this second period of room temperature storage is depicted by the plot 65. As shown by the plot 65, the second period of room temperature storage causes the charge losses to increase to between 0.7 to 1.6 Volts.

The devices of the second wafer are not baked at high temperature. Consequently, there is not an acceleration of the diffusion of the positive ions and a corresponding charge loss caused by this phenomena. Therefore, the charge loss depicted by the plots 64 and 65 are the result of stresses induced in the tunnel oxide of the devices of the second wafer caused by the program erase cycling.

In screening methods of the prior art and in the improved screening method of the present invention, both a high temperature bake step and a room temperature storage step are used. In the screening method of the present invention, the duration of the storage at room temperature is controlled and consistent. On the other hand, in prior art screening methods the duration of the room temperature storage is not consistent between implementations of screening methods. In such cases, erroneous conclusions may be drawn.

For example, consider the charge losses illustrated by the plots 63, 64, and 65. The charge losses depicted by these plots reflect the amount of charge loss from the floating gate of a device of a wafer subjected to three different screening procedures wherein the duration of the room temperature storage period, that precedes a high temperature bake, is varied. The charge losses shown by the plot 63 is caused by tunnel oxide damage resulting from program erase cycling, and illustrate the charge loss from a wafer subjected to a first screening procedure wherein the room temperature storage period is of very short duration. The charge losses depicted by the plots 64 and 65 are also caused by program erase cycling experienced during a second and a third screening procedure wherein the duration of the room temperature storage period is much longer, i.e., 109 and 155 hours, respectively. If, in all three screening procedures, the room temperature storage is followed by a bake at temperatures greater than 250° C., then any damage to the tunnel oxide caused by program erase cycling would be annealed and further charge loss due to such stress-induced damage would be stopped. Charge losses due to high temperature activation or positive ion diffusion would still occur, but such losses would be relatively small compared to any charge losses caused by program erase cycling. Therefore, in all three screening procedures, the charge losses expected at the end of a high temperature bake step would be substantially similar to the charge losses experienced after the room temperature storage and illustrated by the plots 63, 64 and 65.

One skilled in the art may erroneously attribute charge losses experienced after the high temperature bake to positive ions disposed in the oxide and thereby alter process parameters and methods. This is not an unreasonable conclusion since it is believed that high temperature baking accelerates charge loss caused by positive ions disposed in the oxide.

Also, if the duration of the room temperature storage period is not held constant for different implementations of a screening procedure then misleading results may occur. For example, the charge losses expected after a high temperature bake for the first, the second, and the third screening procedures will be plots substantially similar to the plots 63, 64 and 65, respectively. Thus, as the time spent at room temperature increases the charge loss from the floating gate also increases. Consequently, a screening procedure having a room temperature storage time of 109 hours would likely have a smaller charge loss less than a procedure having a room temperature storage time of 155 hours. One skilled in the art may attribute the difference in charge loss experienced in the second procedure with respect to the charge loss experienced in the third procedure, to positive ions or other factors rather than to the mere fact that the room temperature storage period is of different duration. Again one may be focus on a problem that does not exist.

The improved method of the present invention controls the duration of the room temperature storage and, therefore, independently screens for both room temperature charge loss due to stress-induced leakage in the tunnel oxide and also for high temperature charge loss due to positive ions.

The charge loss due to stress induced tunnel oxide damage can be expressed by the following expression.

$$V_{fg}(t) \cdot B \ln \left[ \frac{1}{\exp\left(\frac{-V_{fg}(o)}{b}\right) + \frac{I_o t}{C_T B}} \right] \quad (1)$$

where $I_o$=proportionality constant $$I_o = 2.59 \times 10^{-22} \frac{A}{\text{cell}}$$

B=constant=0.4V
$C_T$=capacitance of the floating gate of a cell
t=storage time at room temperature after the final erase of the floating gate
$V_{fg}$=absolute value of potential across the tunnel oxide.
Eqn. (1) can be solved for t to get an expression for the length of time of the room temperature storage period. Initially, allow $$V_{fg}(o) - V_{fg}(t) > \Delta V_o \quad (2)$$

where $\Delta V_o$=allowable voltage drop (or charge loss) due to stress-induced tunnel oxide damage.
Then, substitute Eqn. (1) into Eqn. (2):

$$V_{fg}(o) - B \ln\left[\frac{1}{\exp\left(\frac{-V_{fg}(o)}{B}\right) + \frac{I_o t}{C_T B}}\right] < \Delta V_o \quad (3)$$

Finally, rearrange Eqn. (3) and solve for t:

$$t = \left\{\exp\left(\frac{V_{fg}(0) - \Delta V_o}{B}\right) - \exp\left(\frac{-V_{fg}(0)}{B}\right)\right\} \frac{C_T B}{I_o} \quad (4)$$

Although an expression for t has been derived, and a value of 24 hours has been disclosed, it is important to note that the length of the room temperature storage time is not as significant as controlling the length of the room temperature storage time. The length of the room temperature storage time is dependent upon the processes used to fabricate the particular devices involved. Also, the lenth of the room temperature storage time is dependent on the particular production capacities and facilities involved. When performing a plurality of screening procedures on a plurality of lots of similar memory devices or PLDs, the length of t (whatever it is) must be kept consistent from one implementation of the screening procedure to another.

Figure 6:
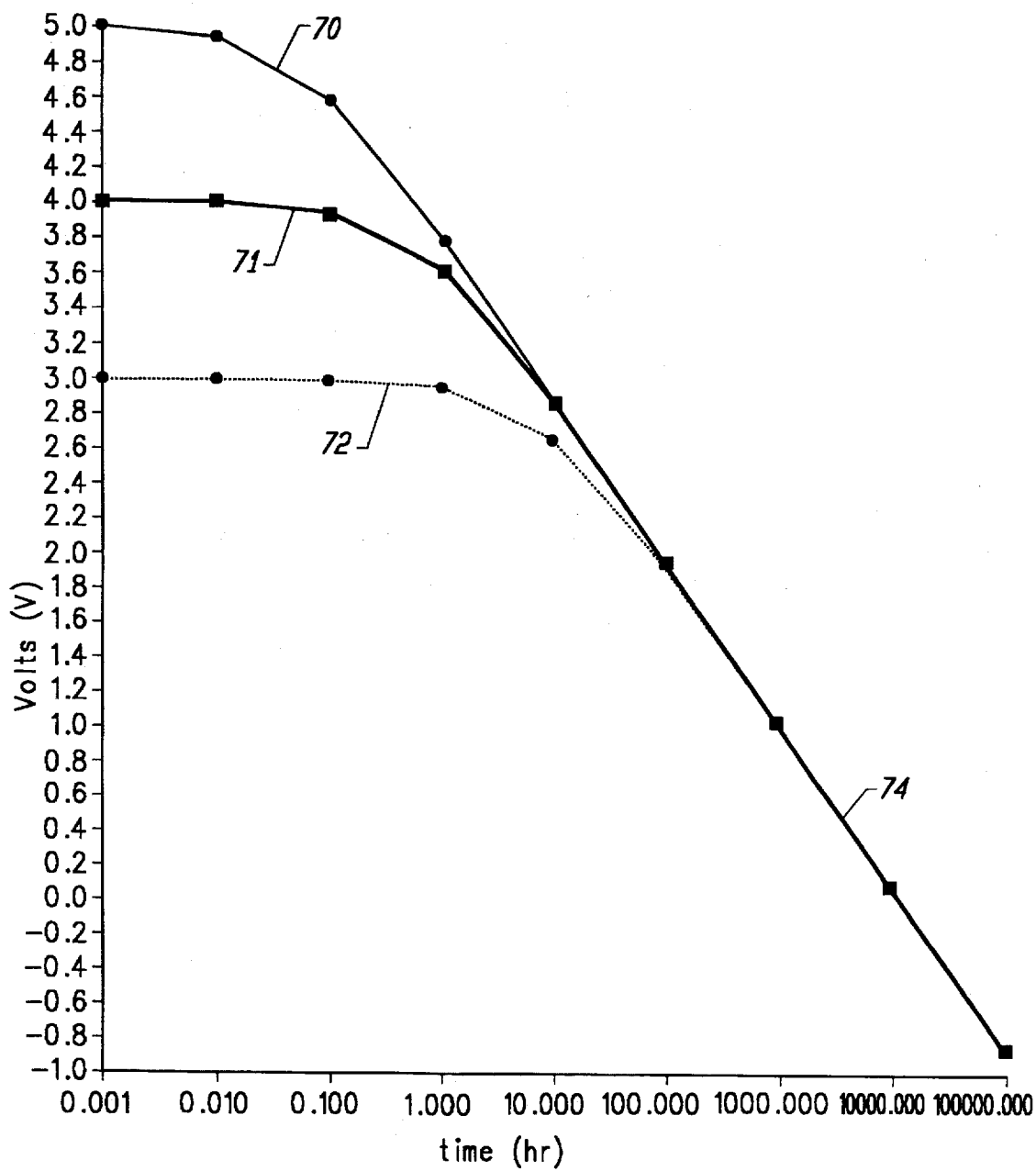
FIG. 6 illustrates three plots of charge loss over time, with the charge loss measured as the voltage across the floating gate of a cell of a device.

FIG. 6 illustrates three plots of charge loss over time, with the charge loss measured as floating gate voltage. Each of the plots 70, 71, and 72 have different $V_{fg}(0)$ values of 5.0, 4.0 and 3.0 Volts respectively. It is important to note that regardless of the initial floating gate voltage all the plots decay into an universal decay line 74 that is dependent upon the thickness of the tunnel oxide used in the device tested. The $V_{fg}(0)$ should not be set too high during the floating gate erase because the charge loss would be large even if the quality of data retention is good. Therefore, for this particular example, $V_{fg}(0)$ should be set between 3.0 and 5.0 Volts.

Figure 7:
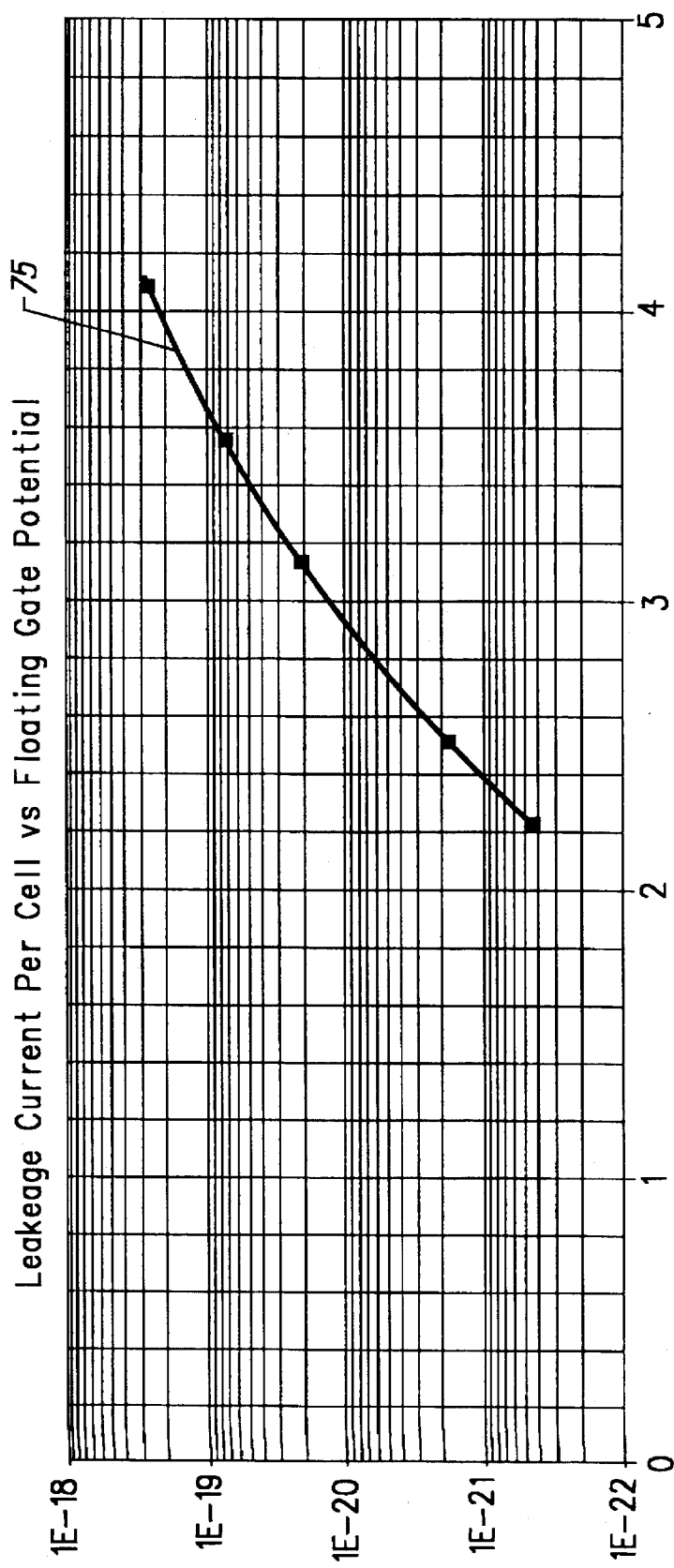
FIG. 7 illustrates a plot of leakage current per cell versus floating gate potential.

FIG. 7 illustrates a plot of leakage current per cell versus floating gate potential. The slope of the line 75 is equal to the coefficient B used in Equations (1) to (4) above. It should be noted that as the voltage decreases, the leakage current per cell also decreases.

Figure 8A:
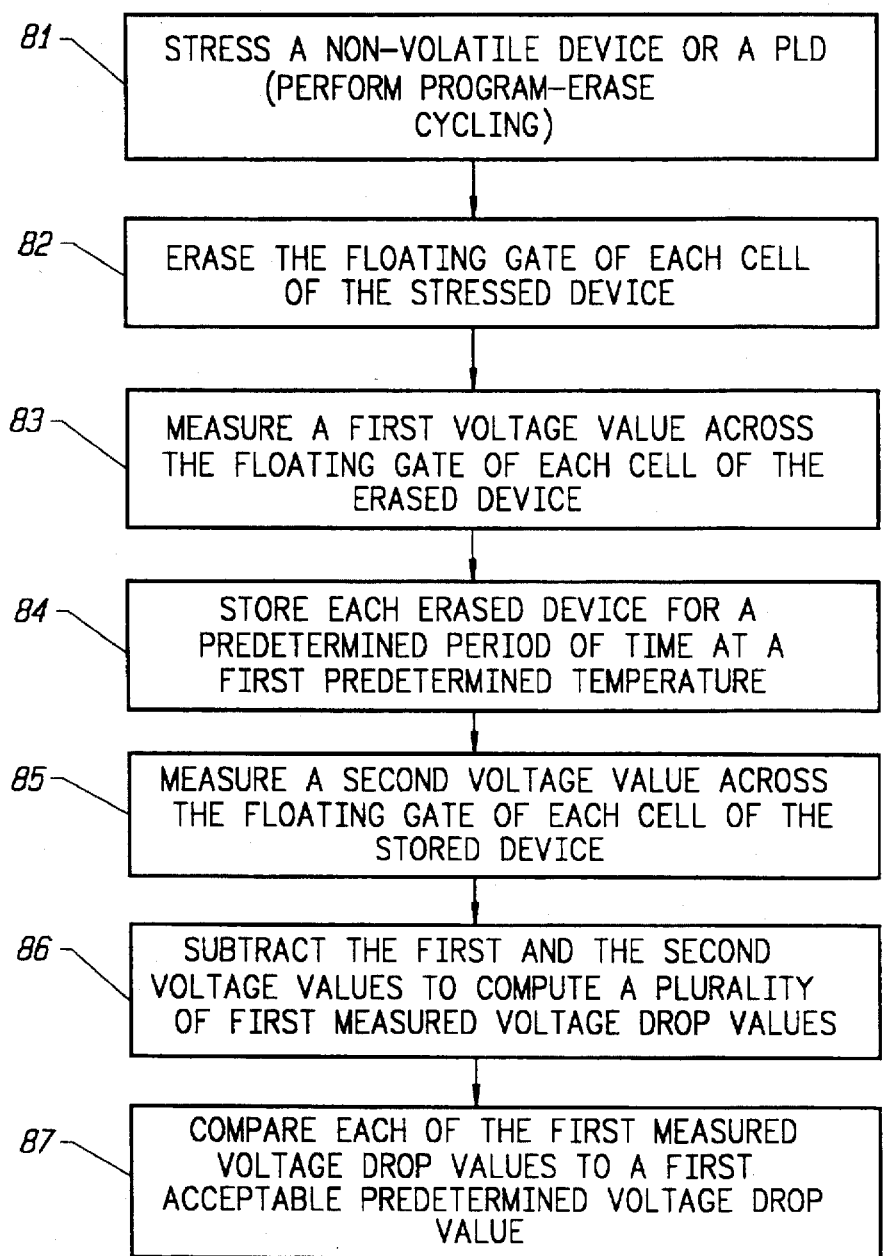
FIG. 8 is a flow chart depicting an alternate method for screening non-volatile memory devices or PLDs.

FIG. 8 is a flow chart depicting an alternate method 80 for screening non-volatile memory devices or PLDs. In this alternate embodiment of the method of the present invention, a voltage value is measured across the floating gate of each cell of a screened device at three different times during the screening procedure. At step 81, a non-volatile memory device or a PLD is program-erase cycled thereby providing a stressed device. Next, at step 82, the floating gate of each cell of the stressed device is erased. A first voltage value is measured, at step 83, across the floating gate of each cell of the erased device. Then, at step 84, the erased device is stored for a predetermined time at a first predetermined temperature. A second voltage value is measured, at step 85, after the erased device is taken out of storage. That is, the second voltage value is measured across the floating gate of each cell of the stored device. Thus, a first and a second voltage value are associated with each cell of the stored device.

Each of the first and the second voltage values are then subtracted to compute, at step 86, a plurality of first measured voltage drop values. Each of the first measured voltage drop values are associated with a cell of the stored device, and are compared at a subsequent step 87 to a first predetermined acceptable voltage drop value. If any of the first measured voltage values are greater than the first acceptable predetermined voltage drop value then, at step 88, the stored device is identified as defective and is discarded. As indicated at step 89, stored devices that are not defective are disposed into the oven and baked at high temperature.

After the device is removed from the baking oven, a third voltage value is measured at step 90, across the floating gate of each cell of the baked device. Therefore, a first and a third voltage value are associated with each cell of the baked device. At step 91, each of the first and the third voltage values are subtracted to compute a plurality of second measured voltage drop values each of which are associated with a specific cell of the baked device. Each of the second measured voltage drop values are compared, at step 92, to a second acceptable predetermined voltage drop value. Next at step 93, if any second measured voltage drop value is greater than the second acceptable predetermined voltage drop value, then the baked device is identified as defective and is discarded. Thus, the data retention capability of a memory device or a PLD is tested twice in this alternate embodiment of the method of the present invention. Typical values for the first and the second predetermined temperatures, and the predetermined time period have been identified earlier in the description related to FIG. 2.

Although the present invention has been described above in terms of specific embodiments, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. A method for screening a semiconductor device having a plurality of non-volatile memory cells, comprising the steps:
   a) alternatingly programing and then erasing said device for a number of cycles thereby providing a stressed device;
   b) erasing said stressed device thereby providing an erased device;
   c) storing said erased device for a fixed period of time at a first temperature thereby providing a stored device;
   d) baking said stored device at a second temperature thereby providing a baked device; and
   e) determining a first voltage drop value of each cell of said baked device.

2. A method for screening a semiconductor device recited in claim 1, wherein said first temperature is room temperature.

3. A method for screening a semiconductor device recited in claim 2, wherein said second temperature is greater than or equal to 250° C.

4. A method for screening a semiconductor device recited in claim 1, further comprising the steps:

a) comparing each of said first voltage drop values to an acceptable voltage drop value, b) identifying a device having a first voltage drop value greater than said acceptable voltage drop value, as a defective device; and c) discarding said defective device.

5. A method for screening a semiconductor device recited in claim 4, wherein said first temperature is room temperature.

6. A method for screening a semiconductor device recited in claim 5, wherein said second temperature is greater than or equal to 250° C.

7. A method for screening a semiconductor device recited in claim 1, further comprising the step:

a) measuring a second voltage value across a floating gate of each cell of said stored device.

8. A method for screening a semiconductor device recited in claim 7, wherein said first temperature is room temperature.

9. A method for screening a semiconductor device recited in claim 8, wherein said second temperature is greater than or equal to 250° C.

10. A method for screening a semiconductor device recited in claim 7, further comprising the steps:

a) comparing said first voltage drop value to a first acceptable voltage drop value;

b) comparing each of said second voltage values to a second acceptable voltage drop value;

c) identifying a device having either a first voltage value or a second voltage value greater than said first or said second acceptable voltage drop value, as a defective device; and d) discarding said defective device.

11. A method for screening a semiconductor device recited in claim 10, wherein said first temperature is room temperature.

12. A method for screening a semiconductor device recited in claim 11, wherein said second temperature is greater than or equal to 250° C.

13. The method for screening a semiconductor device of claim 1, wherein step (e) comprises the steps of:

(e1) measuring a first voltage across a floating gate of each cell of said erased device of step (b);

(e2) measuring a second voltage across a floating gate of each cell of said baked device of step (d); and (e3) subtracting said first and second voltages thereby providing the first voltage drop value.

14. The method for screening a semiconductor device of claim 1, further including the step of:

(f) comparing said first voltage drop value to an acceptable voltage drop value.

15. A method for screening a semiconductor device having a plurality of non-volatile memory cells, comprising the steps of:

a) alternatingly programming and then erasing said device for a predetermined number of cycles thereby providing a stressed device;

b) erasing said stressed device thereby providing an erased device;

c) measuring a first voltage across a floating gate of each cell of said erased device;

d) storing said erased device for a fixed period of time at a first temperature thereby providing a stored device;

e) baking said stored device at a second temperature thereby providing a baked device;

f) measuring a second voltage across a floating gate of each cell of said baked device;

g) determining a first voltage drop value based on said first measured voltage and said second measured voltage; and h) comparing said first voltage drop value to an acceptable voltage drop value.

16. The method of screening a semiconductor device of claim 15, further including the steps of:

i) baking said device at a second temperature for a second period of time;

j) measuring a third voltage across a floating gate of each cell of said device baked in step (i);

k) determining a second voltage drop value based on said first measured voltage and said third measured voltage;

l) comparing said second voltage drop value to an acceptable voltage drop value;

m) identifying a device having a voltage drop value greater than said acceptable voltage drop value, as a defective device; and n) discarding said defective device.

17. The method of screening a semiconductor device of claim 15, wherein step (g) comprises the steps of subtracting said first measured voltage from said second measured voltage.

18. The method of screening a semiconductor device of claim 16, wherein step (k) comprises the step of subtracting said first measured value from said third measured value.

19. The method of screening a semiconductor device of claim 15, wherein the fixed period of time in step (d) is about 24 hours.

20. The method of screening a semiconductor device of claim 15, wherein said first temperature of step (d) is room temperature.

21. The method of screening a semiconductor device of claim 15, wherein said second temperature of step (e) is greater than or equal to 250° C.

* * * * *